United States Patent
Fuentes et al.

(10) Patent No.: US 11,218,161 B1
(45) Date of Patent: Jan. 4, 2022

(54) TRACKING ANALOG-TO-DIGITAL CONVERTER WITH ADAPTIVE SLEW RATE BOOSTING

(71) Applicant: Allegro MicroSystems, LLC, Manchester, NH (US)

(72) Inventors: Leandro Fuentes, Caba (AR); Manuel Rivas, Ciudad de Buenos Aires (AR); Patricio Hernan Perez Preiti, Vicente Lopez (AR); Bruno Luis Uberti, Ciudad Autonoma de Buenos Aires (AR); Alejandro Gabriel Milesi, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/098,905

(22) Filed: Nov. 16, 2020

(51) Int. Cl.
*H03M 3/00* (2006.01)
*H03M 1/18* (2006.01)
*H03M 1/06* (2006.01)
*H03K 5/24* (2006.01)

(52) U.S. Cl.
CPC .............. *H03M 3/374* (2013.01); *H03K 5/24* (2013.01); *H03M 1/0617* (2013.01); *H03M 1/181* (2013.01); *H03M 3/354* (2013.01); *H03M 3/436* (2013.01); *H03M 3/464* (2013.01)

(58) Field of Classification Search
CPC ...... H03M 3/374; H03M 3/354; H03M 3/436; H03M 3/464; H03M 1/181
See application file for complete search history.

(56) References Cited

U.S. PATENT DOCUMENTS

| | | | | |
|---|---|---|---|---|
| 4,357,600 A | * | 11/1982 | Ressmeyer | H03M 1/52 341/129 |
| 5,781,138 A | * | 7/1998 | Knudsen | H03M 3/388 341/120 |
| 6,049,298 A | * | 4/2000 | Knudsen | H03M 3/388 341/118 |
| 6,188,340 B1 | * | 2/2001 | Matsumoto | G01D 3/02 341/110 |
| 6,518,893 B1 | * | 2/2003 | Robinson | H03M 5/20 341/56 |
| 7,474,247 B1 | * | 1/2009 | Heinks | A61N 1/3706 341/143 |
| 8,779,805 B1 | | 7/2014 | Fernandez et al. | |

(Continued)

OTHER PUBLICATIONS

Allegro MicroSystems; "Datasheet A1468: Three-Wire True Zero-Speed Differential Peak-Detecting Sensor IC with Continuous Calibration;" Downloaded from www.allegromicro.com; Feb. 27, 2020; 15 Pages.

(Continued)

*Primary Examiner* — Lam T Mai
(74) *Attorney, Agent, or Firm* — Daly, Crowley, Mofford & Durkee, LLP

(57) ABSTRACT

A tracking ADC with adaptive slew rate boosting can dynamically adjust one or more of its operational parameters in response to detecting a slew rate limit condition. In some embodiments, slew rate boosting can include increasing the value of a digital error signal in response to detection of a slew rate limit condition. In other embodiments, slew rate boosting can include increasing a clock frequency of the tracking ADC in response to detection of a slew rate limit condition.

17 Claims, 10 Drawing Sheets

(56) References Cited

U.S. PATENT DOCUMENTS

| | | | |
|---|---|---|---|
| 9,294,084 | B1 | 3/2016 | McIntosh et al. |
| 9,379,708 | B2 | 6/2016 | Martin et al. |
| 9,425,785 | B1 | 8/2016 | Wibben |
| 9,774,257 | B2 | 9/2017 | Wibben et al. |
| 9,781,789 | B1 | 10/2017 | Lee et al. |
| 9,866,227 | B1* | 1/2018 | Bresciani ............... H03M 1/46 |
| 10,075,180 | B2* | 9/2018 | He ........................ H03M 3/368 |
| 10,412,797 | B2 | 9/2019 | Lee |
| 2008/0252500 | A1* | 10/2008 | Strandjord ........... G01C 19/721 |
| | | | 341/143 |
| 2009/0021409 | A1* | 1/2009 | Mathe .................. H03M 3/374 |
| | | | 341/143 |
| 2009/0261998 | A1* | 10/2009 | Chae ...................... H03M 3/46 |
| | | | 341/118 |

OTHER PUBLICATIONS

Allegro MicroSystems; "Datasheet A1688: Two-Wire, True Zero-Speed, High Accuracy Sensor IC;" Downloaded from www.allegromicro.com; Apr. 9, 2020; 10 Pages.

Allegro MicroSystems; "Datasheet ARS19200: ASIL-Compliant Wheel Speed Sensor IC;" Downloaded from www.allegromicro.com; Jan. 14, 2020; 11 Pages.

Allegro MicroSystems; "Datasheet A17301: Three-Wire Zero-Speed Differential Peak-Detecting Sensor IC with Continuous Calibration;" Downloaded from www.allegromicro.com; Oct. 25, 2019; 15 Pages.

\* cited by examiner

TRACKING ANALOG-TO-DIGITAL CONVERTER WITH ADAPTIVE SLEW RATE BOOSTING

BACKGROUND

A tracking analog-to-digital converter (ADC) is a type of ADC that tracks an analog input signal by comparing it to a feedback version of itself generated by a digital-to-analog converter (DAC). When the analog input signal is higher or lower compared to the DAC output signal, the tracking ADC circuitry increments or decrements a digital counter by a value N (e.g., N=1). Tracking ADCs are used in a wide array of systems, devices, and circuits such as speed sensor circuits, peak-detecting sensor circuits, and angle sensor circuits.

FIG. 1 shows a prior art tracking ADC 100 having a comparator 102 that determines whether an analog input signal 104 is greater or lower than a feedback signal 106 generated by a DAC 114. Comparator 102 outputs a digital error signal 108 indicating a sign of the difference between input signal 104 and feedback signal 106. For example, digital error signal 108 can have a value of +/−1. Digital error signal 108 is accumulated by an integrator 110 which can be implemented, for example, as an up/down counter responsive to digital error signal 108. ADC 100 can receive a clock signal (not shown) and the up/down counter can change once per clock period. The output 112 of integrator 110, sometimes referred to as the "code signal," is provided as an output 116 of the ADC and is also fed back as input to the DAC 114.

SUMMARY

Prior art tracking ADCs may have a maximum slew rate of +/−1 per clock period. Thus, if the analog input signal and the feedback signal are separated by multiple least significant bits (LSBs), the integrator will count up or down at a steady rate for multiple consecutive clock periods. In this case, the tracking ADC is said to be in a slew rate limit condition (or "slew rate limited"). In the context of a tracking ADC that utilizes a DAC, the term "least significant bit" or "LSB" refers to the smallest increment of voltage that the DAC can output. When a tracking ADC is in a slew rate limit condition, the update rate of the digital output signal may not be proportional to the error between the input and feedback signals, resulting in distortion.

FIG. 2 illustrates a slew rate limit condition that can occur with a prior art tracking ADC. A first plot 200 has a horizontal axis 202x representing time (e.g., a number of clock periods) and a vertical axis 202y representing analog signal amplitude. Within the first plot 200, a first waveform 204 corresponds to an analog input signal (e.g., signal 104 in FIG. 1) and a second waveform 206 corresponds to a feedback signal generated by the DAC (e.g., signal 106 in FIG. 1). A second plot 220 shares horizontal axis 202x with first plot 200 and has a vertical axis 222y representing digital signal level. Within second plot 220, a first waveform 224 corresponds to the tracking ADC error signal (e.g., signal 108 in FIG. 1) and a second waveform 226 corresponds to the difference between the analog input signal 204 and the feedback signal 206 (e.g., signal 104 minus signal 106 in FIG. 1).

In this example, between time 1500 and time 4250 (indicated on horizontal axis 202x) error signal 224 toggles between +1 and −1, resulting in a feedback signal 206 that closely tracks input signal 204. Starting around time 4250, the slew rate of input signal 204 begins to increase, causing error signal 224 to remain at −1 for several consecutive clock periods. As a result, the difference 226 between the analog input signal and the feedback signal (as an absolute value) grows unbounded. That is, analog input signal 204 and feedback signal 206 grow apart because the DAC update rate cannot keep up with the rate of change of input signal 204. In this example, the slew rate limit condition starting around time 4250 continues until around time 6400, when the slew rate of the input signal 204 decreases. The period during with the tracking ADC is slew rate limited is illustrated by box 230 in FIG. 2.

Turning to FIG. 3, tracking ADCs may be designed around two main parameters: (1) the LSB of the DAC and (2) the sampling frequency, $f_s$. A simplified design procedure for choosing the LSB and $f_s$ parameters is as follows.

The LSB can be chosen based on the quantization noise budget, $B_Q$. The noise budget may be proportional to the minimum input signal amplitude to be processed by the tracking ADC, $B_{min}$. For example, the LSB may be chosen according to the following inequality:

$$LSB \leq \frac{B_Q}{\sqrt{12}} \quad (1)$$

in which $$\frac{B_Q}{\sqrt{12}}$$

is the formula for the standard deviation of the uniform probably distribution. To prevent a slew rate limit condition from occurring, the sampling frequency, $f_s$, can be chosen based on the maximum frequency, $f_{max}$, and maximum amplitude, $B_{max}$, of the analog input signal. The slew rate limit of the tracking ADC is related to the sampling frequency, $f_s$, and the LSB as follows:

$$SR_{TrackADC} = f_s \cdot LSB \quad (2)$$

For a sinusoidal input signal, the maximum slew rate, $SR_{IN}$, occurs at 50% crossing, and can be calculated as:

$$SR_{IN} = \pi \cdot B_{max} \cdot f_{max} \quad (3)$$

The sampling frequency required to process such a signal without distortion should satisfy:

$$f_s \geq \frac{\pi \cdot B_{max} \cdot f_{max}}{LSB} \quad (4)$$

FIG. 3 illustrates certain tracking ADC constraints as a function of sinusoidal input signal frequency and amplitude. Plot 300 includes a log-scale horizontal axis 302x representing input signal frequency, $f_{in}$, in kHZ and a log-scale vertical axis 302y representing input signal amplitude, $B_{in}$, in Gpp (Gauss peak-to-peak). The maximum input signal frequency, $f_{max}$, is denoted by dashed line 304. The minimum and maximum input signal amplitudes, $B_{min}$ and $B_{max}$, are denoted by dashed lines 306 and 308, respectively. In the example of FIG. 3, $f_{max}$ is 5 kHz, $B_{min}$ is 20 Gpp, and $B_{max}$ is 1200 Gpp.

The maximum slew rate of the sinusoidal input signal, $SR_{IN}$, is determined by a hyperbola which, in this log-log plot, is represented by diagonal line 310. Of note, diagonal line 310 ($SR_{IN}$) intersects dashed line 308 ($B_{max}$) at the same point 312 as dashed line 304 ($f_{max}$). In FIG. 3, the region below line 310 represents combinations of input frequency and input amplitude that the tracking ADC can track without being slew rate limited. The region above line 310 represents combinations of input frequency and amplitude for which the tracking ADC is slew rate limited. It is appreciated herein that a tracking ADC's slew rate limit needs to match or be set above the point 312.

Three notable regions are identified in the illustrative plot 300. A first region 314, bounded by vertical axis 302$y$ and dashed lines 304, 306, 308, is the tracking ADC's operating region. The operating region 314 represents the input signal frequency and amplitude pairs for which the tracking ADC can process the input signal without distortion. A second region 316, bounded by vertical axis 302$y$, dashed line 308, and diagonal line 310, represents the region beyond the full-scale range of the DAC, which is sized for the maximum input signal amplitude, $B_{max}$. A third region 318, bounded by dashed line 304, dashed line 306, and diagonal line 310, represents a region that may be limited by a digital low-pass filter through which the input signal is passed. It is noted that, within third region 318, the maximum input signal amplitude decreases with increasing frequency. Thus, a tracking ADC may be partially usable when operating within third region 318.

It is appreciated herein that existing tracking ADCs may be designed to meet the slew rate limit requirement, $SR_{IN}$, but that this requirement is dictated by a single corner case $f_{max}$, $B_{max}$ denoted as point 312 in FIG. 3. It is further appreciated here that when a tracking ADC operates at or near the slew rate limit corner case $f_{max}$, $B_{max}$, there may be little or no benefit in having a small LSB because the LSB parameter is typically chosen based on the minimum input signal amplitude, $B_{min}$. Existing tracking ADCs have been designed to satisfy the slew rate limit requirement for "fast and large" signals (i.e., signals having a frequency near $f_{max}$ and an amplitude near $B_{max}$) and, at the same time, to satisfy the noise performance requirement for "small" signals (i.e., signals having an amplitude near $B_{min}$).

Described herein are embodiments of a tracking ADC with adaptive slew rate boosting. The term "slew rate boosting" herein refers to dynamically adjusting one or more operational parameters of a tracking ADC in response to detecting a slew rate limit condition. In some embodiments, slew rate boosting can include increasing the value of a digital error signal in response to detection of a slew rate limit condition. In other embodiments, slew rate boosting can include increasing a clock frequency of the tracking ADC in response to detection of a slew rate limit condition. The structures and techniques disclosed herein can be used to provide tracking ADCs that have similar (or identical) specifications compared to conventional tracking ADCs, but that can operate at a slower (nominal) clock frequency, thus reducing power and size requirements and improving efficiency.

According to one aspect of the present disclosure, a tracking analog-to-digital converter (ADC) includes: a comparator having a first input to receive an analog input signal, a second input to receive an analog feedback signal, and an output to provide a digital error signal responsive to a comparison between the analog input signal and the analog feedback signal; a slew rate detection circuit to generate a slew rate detection signal responsive to a slew rate of the analog input signal; an error adjustment circuit having a first input to receive the digital error signal, a second input to receive the slew rate detection signal, and an output to provide an adjusted error signal responsive to the digital error signal and the slew rate detection signal; an integrator having an input to receive the adjusted error signal and an output to provide a digital output signal having a value that increases or decreases at each period of a clock according to the adjusted error signal; and a digital-to-analog converter (DAC) having an input to receive the digital output signal and an output to provide the analog feedback signal responsive to the digital output signal.

In some embodiments, the slew rate detection circuit may be configured to generate the slew rate detection signal responsive to a slew rate of the analog input signal using an input signal corresponding to at least one: the digital error signal; the adjusted error signal; or the digital output signal. In some embodiments, the slew rate detection circuit can include: a discrete-time integrator to integrate the slew rate detector input signal over N clock periods to generate an integrated signal; and one or more comparators to compare a value of the integrated signal to one or more respective threshold values, wherein the slew rate detection signal has a value responsive to outputs of the one or more comparators. In some embodiments, the one or more comparators can include at least a first comparator to compare the value of the integrated signal to a first threshold value greater than zero and a second comparator to compare the value of the integrated signal to a second threshold value less than zero, the slew rate detection circuit further comprising: a logic gate to generate an intermediate slew rate detection signal responsive to outputs of the one or more comparators; and a D latch configured to update the value of slew rate detection signal to match that of intermediate slew rate detection signal according to a reset signal. In some embodiments, the slew rate detection circuit can include: a discrete finite impulse response (FIR) filter to calculate a moving sum of the slew rate detector input signal over N clock periods; and one or more comparators to compare the moving sum of the integrated signal to one or more respective threshold values, wherein the slew rate detection signal has a value responsive to outputs of the one or more comparators.

In some embodiments, the slew rate detection circuit may be configured to generate the slew rate detection signal responsive to a slew rate of the analog input signal using hysteresis. In some embodiments, the error adjustment circuit can be configured to generate the adjusted error signal by multiplying the digital error signal by a first multiplier value if the slew rate detection signal has a first value and multiplying the digital error signal by a second multiplier value if the slew rate detection signal has second value. In some embodiments, the first multiplier value may be equal to one and the second multiplier value is greater than one. In some embodiments, the error adjustment circuit can include: a multiplexer to selectively output the one of a plurality of multiplier values responsive to a value of the slew rate detection signal, the plurality of multiplier values including at least the first multiplier value and the second multiplier value; and a digital multiplier to multiply the digital error signal by the output of the multiplexer to generate the adjusted error signal. In some embodiments, the error adjustment circuit can include: a first amplifier to amplify the digital error signal by one of the first multiplier value or the second multiplier value; a switch to having a first input coupled to receive a first input signal from an output of the first amplifier and a second input signal corresponding to either the digital error signal or an output of a second amplifier configured to multiply the digital error signal by the other one of the first multiplier value or the second multiplier value, the switch configured to selectively output the first input signal or the second input signal as the adjusted digital error signal responsive to a value of the slew rate detection signal.

According to another aspect of the present disclosure, a tracking ADC includes: a comparator having a first input to receive an analog input signal, a second input to receive an analog feedback signal, and an output to provide a digital error signal responsive to a comparison between the analog input signal and the analog feedback signal; a slew rate detection circuit to generate a slew rate detection signal responsive to a slew rate of the analog input signal; a clock adjustment circuit having an input to receive the slew rate detection signal, and an output to provide commands to adjust a frequency of a clock responsive to the slew rate detection signal; an integrator having an input to receive the digital error signal and an output to provide a digital output signal having a value that increases or decreases at each period of the clock according to the digital error signal; and a digital-to-analog converter (DAC) having an input to receive the digital output signal and an output to provide the analog feedback signal responsive to the digital output signal.

In some embodiments, the slew rate detection circuit may be configured to generate the slew rate detection signal responsive to a slew rate of the analog input signal using an input signal corresponding to at least one: the digital error signal; the adjusted error signal; or the digital output signal. In some embodiments, the slew rate detection circuit can include: a discrete-time integrator to integrate the slew rate detector input signal over N clock periods to generate an integrated signal; and one or more comparators to compare a value of the integrated signal to one or more respective threshold values, wherein the slew rate detection signal has a value responsive to outputs of the one or more comparators. In some embodiments, the one or more comparators may include at least a first comparator to compare the value of the integrated signal to a first threshold value greater than zero and a second comparator to compare the value of the integrated signal to a second threshold value less than zero, the slew rate detection circuit further comprising: a logic gate to generate an intermediate slew rate detection signal responsive to outputs of the one or more comparators; and a D latch configured to update the value of slew rate detection signal to match that of intermediate slew rate detection signal according to a reset signal. In some embodiments, the slew rate detection circuit can include: a discrete finite impulse response (FIR) filter to calculate a moving sum of the slew rate detector input signal over N clock periods; and one or more comparators to compare the moving sum of the integrated signal to one or more respective threshold values, wherein the slew rate detection signal has a value responsive to outputs of the one or more comparators. In some embodiments, the slew rate detection circuit may be configured to generate the slew rate detection signal responsive to a slew rate of the analog input signal using hysteresis.

According to another aspect of the present disclosure, a tracking ADC includes: means for generating a digital error signal responsive to a comparison between an analog input signal and an analog feedback signal; means for integrating the digital error signal or an adjusted version of the digital error signal over multiple clock periods to generate a digital output signal; means for converting the digital output signal to the analog feedback signal; means for detecting a slew rate limit condition of the tracking ADC; and means for adjusting one or more operational parameters of the tracking ADC in response to detection of the slew rate limit condition.

BRIEF DESCRIPTION OF THE DRAWINGS

The manner of making and using the disclosed subject matter may be appreciated by reference to the detailed description in connection with the drawings, in which like reference numerals identify like elements.

The drawings are not necessarily to scale, or inclusive of all elements of a system, emphasis instead generally being placed upon illustrating the concepts, structures, and techniques sought to be protected herein.

DETAILED DESCRIPTION

Figure 4A:
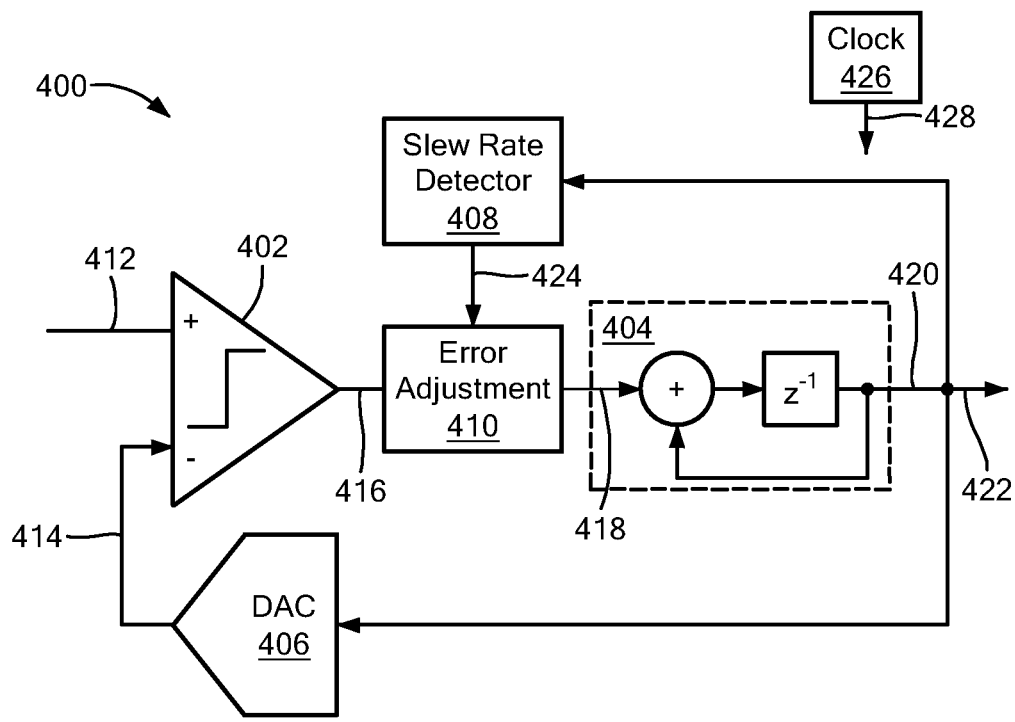
FIG. 4A is a schematic diagram of tracking ADC with adaptive slew rate boosting, according to some embodiments.

FIG. 4A shows a tracking ADC 400 with adaptive slew rate boosting, according to some embodiments of the present disclosure. The illustrative tracking ADC 400 includes a comparator 402, an integrator 404, a DAC 406, a slew rate detection circuit (or "slew rate detector") 408, and an error adjustment circuit (or "adjustment circuit") 410. Tracking ADC 400 can operate a certain frequency determined by a clock 426. Clock 426 and tracking ADC 400 can be provided on the same IC or on separate ICs. Clock 426 can generate a clock signal 428 that can be coupled to one or more elements of the ADC 400. To promote clarity in the drawings, such couplings are not shown in FIG. 4A but are described below.

Comparator 402 is configured to receive, as input, an analog input signal 412 and an analog feedback signal (or simply "feedback signal") 414 generated by DAC 406, and to generate, as output, a digital error signal 416 indicating the sign of the difference between input signal 412 and feedback signal 414. For example, digital error signal 416 can have a value (or "level") of +/−1 (i.e., tracking ADC 400 may be classified as a 1-bit tracking ADC).

Adjustment circuit 410 is configured to receive, as input, digital error signal 416 and a slew rate detection signal 424 generated by slew rate detector 408. In response, adjustment circuit 410 can generate an adjusted error signal 418. In some embodiments, adjusted error signal 418 can have a value that is an integer multiple of the digital error signal 416 value. For example, adjusted error signal 418 can have a value $e_{adj}=e \times n$, where e is the value of digital error signal 416 and n is selected based on the slew rate detection signal 424. As discussed further below, slew rate detection signal 424 can have a value indicative of whether the slew rate of analog input signal 412 exceeds a known baseline slew rate limit of the tracking ADC. As used herein, "baseline slew rate limit" refers to the slew rate limit of a disclosed tracking ADC when the error signal is not adjusted (i.e., $e_{adj}=e$). The baseline slew rate limit is a function of the tracking ADC's design parameters and can be determined empirically. The baseline slew rate limit can be distinguished from the ADC's effective slew rate limit which can vary (i.e., can be "boosted") according to the structures and techniques disclosed here. In some embodiments, slew rate detection signal 424 can have the value one (1) if the ADC is operating at (or near) the baseline slew rate limit, and can have the value zero (0) otherwise. Thus, adjustment circuit 410 can operate to increase the update rate of integrator 404 when a slew rate limit condition is detected. Adjustment circuit 410 can be implemented using digital circuit components and illustrative embodiments are described below in conjunction with FIGS. 5A and 5B.

Integrator 404 is configured to accumulate adjusted error signal 418 over one or more clock periods. Integrator 404 can be implemented, for example, as an up/down counter using digital circuit components. The digital counter can be increased or decreased by a certain amount during each clock period according to clock signal 428. The amount by which the counter is increased/decreased during each clock period is determined by the level of adjusted error signal 418 during that clock period. For example, if adjusted error signal 418 has value $e_{adj}=2$ during a first clock period and a value $e_{adj}=-5$ during a second clock period, then the counter will have decreased by a total of three (3) following the second clock period. Integrator 404 can provide, as output, the accumulated adjusted error signal 420 (or "code signal"). Code signal 420 can be provided as an output 422 of the tracking ADC 400, and also as input to both DAC 406 and slew rate detector 408.

Slew rate detector 408 is configured to detect if the tracking ADC is operating at or above its known baseline slew rate limit and to generate slew rate detection signal 424 responsive to this determination. In the embodiment of FIG. 4A, slew rate detector 408 can detect a slew rate limit condition using code signal 420. Slew rate detector 408 can be implemented using digital circuit components and illustrative embodiments are described below in conjunction with FIGS. 6A and 6B.

In operation, tracking ADC 400 can function as a conventional tracking ADC until a slew rate limit condition is detected. In response to detecting a slew rate limit condition, tracking ADC 400 can automatically upscale (or "boost") the level of error signal 416 by multiplying it by an value greater than one, thereby increasing the rate of change of the integrator 404 and increasing the effective slew rate limit of the ADC 400. Compared to conventional tracking ADCs, the disclosed tracking ADC 400 can exhibit reduced distortion when operating on "fast" and/or "large" signals. When the slew rate limit condition ends, tracking ADC 400 can automatically downscale the level of error signal 416 to improve noise performance with "slow" and/or "small" signals. By dynamically adapting to the slew rate of the input signal, tracking ADC 400 can process an analog input signal having a slew rate that substantially exceeds the baseline slew rate limit for which it was designed. Compared to existing tracking ADCs capable of handling the same maximum slew rates, tracking ADC 400 can operate at a slower frequency, thus reducing power and size requirements and providing improved efficiency. The illustrative tracking ADC 400 provides adaptive slew rate boosting without relying on any external control means, such as an offset or gain adjustment means within a front-end and controller.

Figure 4B:
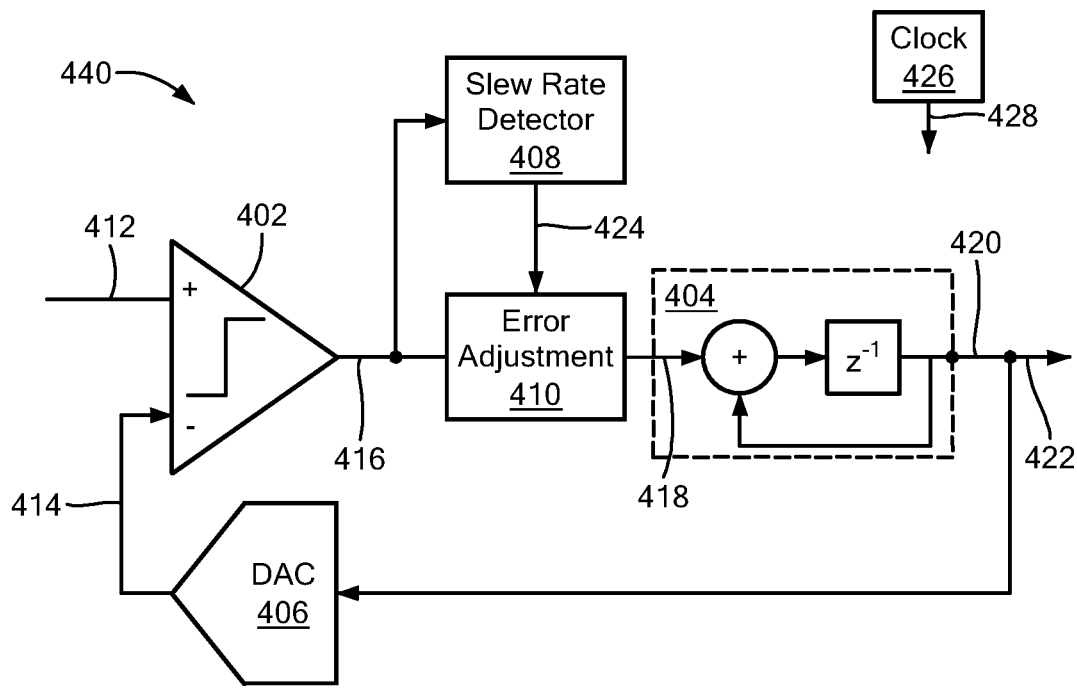
FIG. 4B is a schematic diagram of another tracking ADC with adaptive slew rate boosting, according to some embodiments.

FIG. 4B shows another tracking ADC 440 with adaptive slew rate boosting. In the embodiment of FIG. 4B, tracking ADC 440 includes a slew rate detector 408 configured to receive digital error signal 416 as input and to detect a slew rate limit condition using digital error signal 416, rather than the code signal 420. In other embodiments, slew rate detector 408 may be configured to detect a slew rate limit condition using adjusted error signal 418 as input (e.g., so that it can predict the change of rate of code signal 420). The various slew rate detection mechanisms disclosed herein can utilize, or be adapted to utilize, any of signals 416, 418, or 420 as input. The operation and performance of tracking ADC 440 (FIG. 4B) may be the same as or similar to that of tracking ADC 400 (FIG. 4A).

Figure 4C:
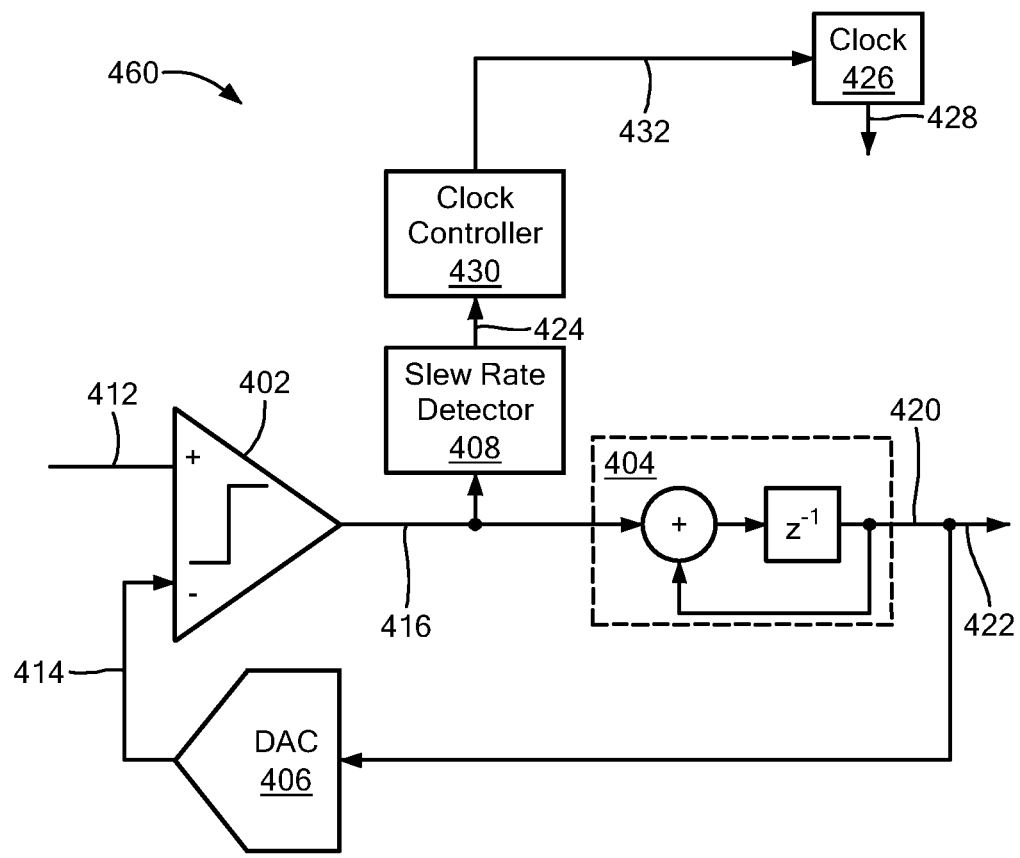
FIG. 4C is a schematic diagram of another tracking ADC with adaptive slew rate boosting, according to some embodiments.

FIG. 4C shows another tracking ADC 460 with adaptive slew rate boosting. In the embodiment of FIG. 4C, tracking ADC 460 can adjust the clock frequency in response to detecting a slew rate limit condition. In the embodiment of FIG. 4C, clock control circuit (or "clock controller") 430 is coupled between slew rate detector 408 and clock 426. As shown, error adjustment circuit 416 can be omitted in the embodiment of FIG. 4C such that digital error signal 416 is passed directly to integrator 404. Clock controller 430 can receive the slew rate detection signal 424 and provide commands 432 to the clock 426 in response thereto. For example, in response to a slew rate limit condition, clock controller 430 can command clock 426 to increase its frequency (e.g., above a standard operating frequency). Increasing the clock frequency can improve the performance of a tracking ADC in terms of conversion errors from a systemic point of view. When the slew rate limit condition ends, clock controller 430 can command clock 426 to decrease its frequency (e.g., back down to its standard operating frequency). In the embodiment of FIG. 4C, slew rate detector 408 uses digital error signal 416 to detect a slew rate limit condition. In other embodiments, slew rate detector 408 can use code signal 420 for this purpose. In some embodiments, a tracking ADC according to the present disclosure can implement both clock frequency boosting (as in FIG. 4C) and error signal boosting (as in FIGS. 4A and 4B).

Figure 5A:
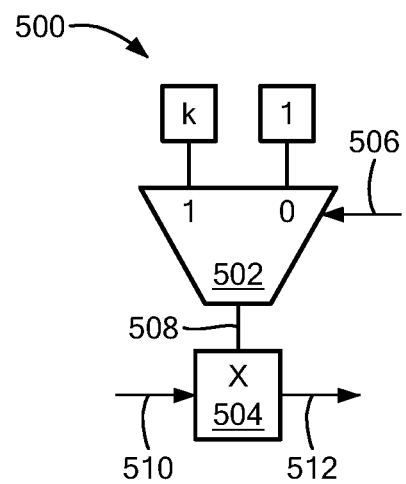
FIG. 5A is a schematic diagram of error adjustment circuit that can be used within a tracking ADC, according to some embodiments.

Turning to FIG. 5A, an illustrative adjustment circuit 500 that can be used within a disclosed tracking ADC includes a multiplexer 502 and a digital multiplier 504. Multiplexer 502 is configured to receive, as input, a slew rate detection signal 506 and to output a multiplier value, m, 508 selected from a plurality of multiplier values based the slew rate detection signal 506. For example, multiplexer 502 can output a first value (e.g., m=1) if slew rate detection signal 506 has a first value (e.g., zero), and can output a second value (e.g., m=k, where k is an integer >0) if slew rate detection signal 506 has a second value (e.g., one). In this example, adjustment circuit 500 can select between two possible multiplier values, m∈{1, k}. In some embodiments, adjustment circuit 500 can select between more than two multiplier values, m∈{1, $k_1$, $k_2$, . . . }. The plurality of multiplier values may be hardcoded within the circuit 500 or stored in an EEPROM (electrically erasable programmable read-only memory) accessible to the circuit 500.

Digital multiplier 504 is configured to receive a digital error signal 510 as input and to multiply the digital error signal 504 by the selected multiplier value 508 to generate an adjusted error signal 512 as output. Illustrative adjustment circuit 500 can be used with tracking ADC 400 of FIG. 4A and/or tracking ADC 440 of FIG. 4B. For example, signals 506, 510, and 512 in FIG. 5A may correspond to signals 424, 416, and 418, respectively, in FIGS. 4A and 4B.

Figure 5B:
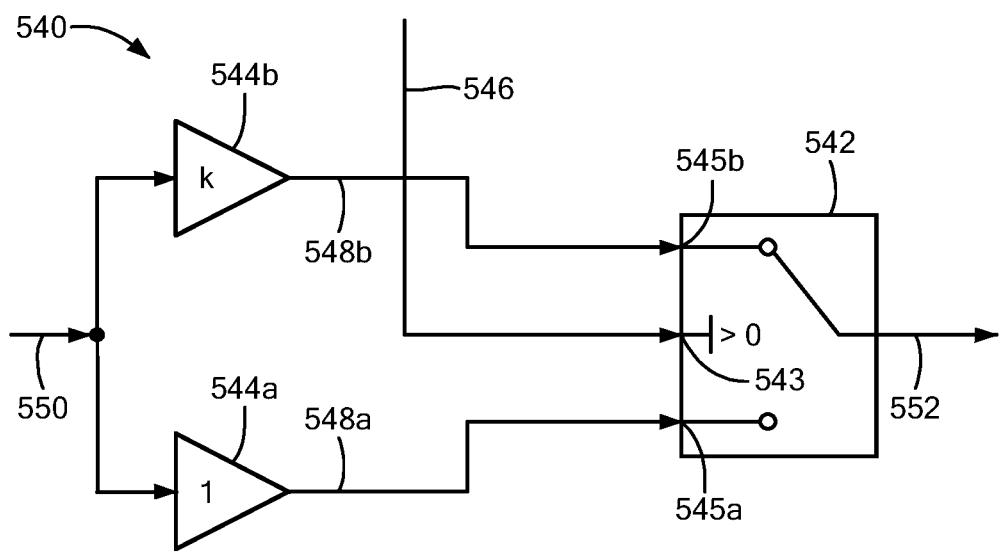
FIG. 5B is a schematic diagram of another error adjustment circuit that can be used within a tracking ADC, according to some embodiments.

FIG. 5B shows another example of an adjustment circuit 540 that can be used within a disclosed tracking ADC. The illustrative adjustment circuit 540 includes a switch 542 and a plurality of amplifiers 544a, 544b, etc. (544 generally). Switch 542 is configured to receive a slew rate detection signal 546 at a control terminal 543 and outputs of the plurality of amplifiers 544a, 544b, etc. at corresponding input terminals 545a, 545b, etc. Amplifiers 544a, 544b, etc. are configured to receive a digital error signal 550 as input and to generate respective amplified signals 548a, 548b, etc. (548 generally) as output. Each of the amplifiers 544 may be configured to have different gain value, g. In the example of FIG. 5B, a first amplifier 544a has a gain of one (1) and a second amplifier 544b has a gain of k. Based on the level of the slew rate detection signal 546, switch 542 can select between one of the amplified signals 548 to provide an adjusted error signal 552 as output. For example, switch 542 can output a first amplified signal 548a (e.g., the error signal 550 amplified by gain g=1) if slew rate detection signal 546 has a first value (e.g., zero), and can output a second amplified signal 548b (e.g., the error signal 550 amplified by gain g=k, where k is an integer >0) if slew rate detection signal 546 has a second value (e.g., one). In this example, adjustment circuit 540 can select between two possible gains values, g∈{1, k}. In some embodiments, adjustment circuit 540 can select between more than two gain values, g∈{1, $k_1$, $k_2$, . . . }. In the case where a particular gain value is equal to one, the corresponding amplifier 544 can be omitted such that the digital error signal 550 is coupled directly to an input of switch 542. The plurality of gain values may be hardcoded within the circuit 500 or stored in an EEPROM (electrically erasable programmable read-only memory) accessible to the circuit 540. Illustrative adjustment circuit 540 can be used with tracking ADC 400 of FIG. 4A and/or tracking ADC 440 of FIG. 4B. For example, signals 546, 550, and 552 in FIG. 5A may correspond to signals 424, 416, and 418, respectively, in FIGS. 4A and 4B.

Figure 6A:
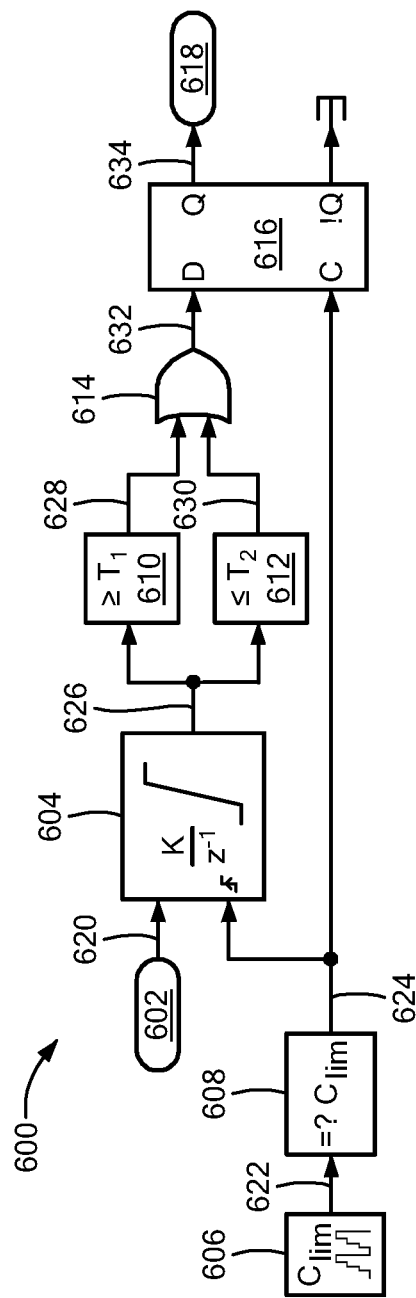
FIG. 6A is a schematic diagram of a slew rate detection circuit that can be used within a tracking ADC, according to some embodiments.

FIG. 6A shows an example of a slew rate detection circuit 600 that can be used within a tracking ADC, such as a tracking ADC embodiment described above in the context of FIG. 4A, 4B, or 4C. The illustrative slew rate detection circuit (or "slew rate detector") 600 includes an input 602, a resettable discrete-time integrator 604, a counter 606, a first comparator 608, a second comparator 610, a third comparator 612, a logic gate 614, a D latch 616, and an output 618. Circuit input 602 may be configured to receive an input signal 620 which may, for example, correspond to digital error signal 416 in FIGS. 4B-4C. In some embodiments, input signal 620 may correspond to an adjusted error signal, such as adjusted error signal 418 of FIG. 4B, or a code signal, such as code signal 420 of FIG. 4B. Thus, slew rate detector 600 can measure the update rate of the code signal directly or indirectly. In some embodiments, circuit 600 can be adapted to handle input signals 620 with larger bit-widths. For example, integrator 604 may be chosen to have a bit-width greater than or equal to that of input signal 620.

Counter 606 is configured to generate a counter signal 622 having a digital value that increases by one each clock period (e.g., according to clock signal 428) until a maximum value, $C_{lim}$, is reached. When the maximum value is reached, counter signal 622 value resets to zero and the process is repeated. For example, with $C_{lim}$=9, the level of counter signal 622 can follow the sequence 0, 1, 2, 4, 5, 6, 7, 8, 9, 0, 1, 2, etc. First comparator 608 compares the counter signal 622 level to the maximum counter value, $C_{lim}$, and generates a reset signal 624 indicating whether the counter signal 622 level is equal to the maximum counter value, $C_{lim}$. For example, reset signal 624 can have the value one (1) if the counter signal 622 level is equal to the counter reset value, $C_{lim}$, and can have the value zero (0) otherwise. Thus, reset signal 624 can have the value one (1) once every $N=C_{lim}+1$ clock periods.

Discrete-time integrator 604 receives digital error signal 620 and reset signal 624 as inputs. Discrete-time integrator 604 is configured to integrate the digital error signal 620 over one or more clock periods (e.g., according to clock signal 428) and to reset to zero when reset signal 624 has the value one (1). That is, integrator 604 can integrate digital error signal 620 over N clock periods to generate an integrated signal 626 having a value in the range of −N to +N (assuming digital error signal 620 has a value of +/−1).

Second comparator 610 is configured to receive the integrated signal 626 and to generate a first detection signal 628 indicating whether the integrated signal 626 has a value greater than or equal to a first predetermined threshold value, $T_1$. For example, first detection signal 628 may have the value one (1) if the integrated signal 626 level is greater than or equal to $T_1$, and the value zero (0) otherwise. Third comparator 612 is configured to receive the integrated signal 626 and to generate a second detection signal 630 indicating whether the integrated signal 626 has a value less than or equal to a second predetermined threshold value, $T_2$. For example, second detection signal 630 may have the value one (1) if the integrated signal 626 level is less than or equal to $T_2$, and the value zero (0) otherwise.

Logic gate 614 is configured to receive the first and second detection signals 628, 630 and to generate an intermediate slew rate detection signal 632 indicating whether either the first or second detect signals 628, 630 has a value of one (1). In some embodiments, logic gate 614 can be implemented as an OR gate. The illustrative circuit of FIG. 6A shows a logic gate 614 receiving input from two comparators 610, 612 having respective threshold values $T_1$, $T_2$. In some embodiments, logic gate 614 can receive input from three or more comparators having respective threshold values $T_1$, $T_2$, $T_3$, etc.

D latch 616 is configured to receive intermediate slew rate detection signal 632 at a data input (D) and reset signal 624 at a clock input (C) and to generate an output signal (or "flag") 634 indicating whether a slew rate limit condition is detected. Slew rate detection signal 634, which is provided at output 618, may correspond to slew rate detection signal 424 of FIGS. 4A-4C. When reset signal 624 has a value of one (1), D latch 616 can updated the value of slew rate detection signal 634 to match that of intermediate slew rate detection signal 632. When reset signal 624 has a value of zero (0), D latch 616 can hold the value of slew rate detection signal 634. Thus, the output 618 of slew rate detector 600 changes at most once every N clock periods.

The illustrative circuit 600 operates on the principle that, during a slew rate limit condition, a tracking ADC's digital error signal will tend to remain at the same value (e.g., +1 or −1) for several consecutive clock periods.

In one example, N=10, $T_1$=8, and $T_2$=−8, meaning that slew detector 600 will indicate a slew rate limit condition exists if the digital error signal 620 sums to an absolute value of at least 8 within 10 consecutive clock periods following a reset. The parameters N, $T_1$, $T_2$ may be selected to achieve certain dynamics in a system/device in which slew rate detector 600 will be used. For example, parameters N, $T_1$, $T_2$ can be chosen based according to a desired minimum/maximum time required for slew rate boosting to activate. These parameters can be determined, for using, using experimentation and/or simulation. Other system-level parameters, such as noise level on the input signal, may be used to select a value for N, or to select values of $T_1$, $T_2$ closer or farther away from N. The value N determines how may bits are required for discrete-time integrator 604 and comparators 610, 612. Thus, in some embodiments, a smaller value may be selected for N in order to reduce the cost, size, and/or power requirements of a system or device in which circuit 600 is employed. The parameters N, $T_1$, $T_2$ may be hardcoded within slew rate detector 600 or stored in an EEPROM accessible thereto.

Figure 6B:
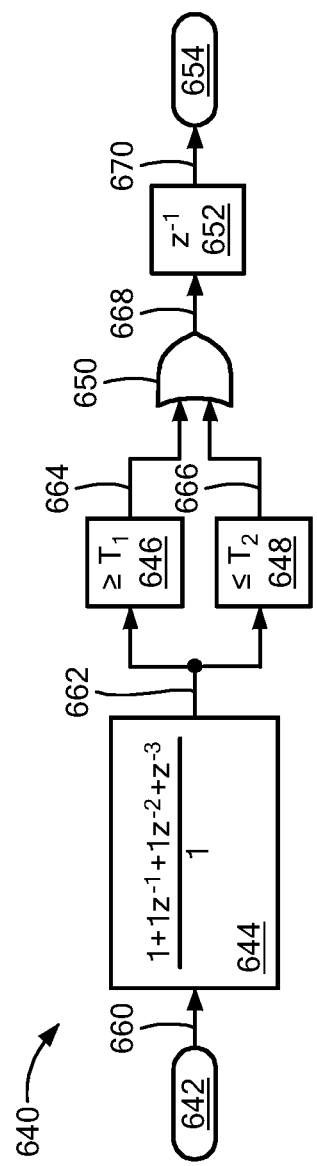
FIG. 6B is a schematic diagram of another slew rate detection circuit that can be used within a tracking ADC, according to some embodiments.

FIG. 6B shows another example of a slew rate detection circuit 640 that can be used within a tracking ADC, such as a tracking ADC embodiment described above in the context of FIG. 4A, 4B, or 4C. The illustrative slew rate detection circuit (or "slew rate detector") 640 includes an input 642, a discrete finite impulse response (FIR) filter 644, a first comparator 646, a second comparator 648, a logic gate 650, a delay 652, and an output 654. Circuit input 642 may be configured to receive an input signal 660 which may, for example, correspond to digital error signal 416 in FIGS. 4B-4C. In some embodiments, input signal 660 may correspond to an adjusted error signal, such as adjusted error signal 418 of FIG. 4B or a code signal, such as code signal 420 of FIG. 4B. Thus, slew rate detector 640 can measure the update rate of the code signal directly or indirectly. In some embodiments, circuit 640 can be adapted to handle input signals 660 with larger bit-widths. For example, integrator 604 may be chosen to have a bit-width greater than or equal to that of input signal 660.

Discrete FIR filter 644 is configured to sum the digital error signal 660 over M clock periods. That is, filter 644 may be provided as an M-tap FIR filter with FIG. 6B showing an example of a 4-tap discrete FIR filter 644 (i.e., M=4). As output, FIR filter 644 generates an accumulated signal 662 having a value corresponding to the sum the digital error signal 660 over M clock periods.

First comparator 646 is configured to receive the accumulated signal 662 and to generate a first detection signal 664 indicating whether the accumulated signal 662 has a value greater than or equal to a first predetermined threshold value, $T_1$. For example, first detection signal 664 may have the value one (1) if the accumulated signal 662 level is greater than or equal to $T_1$, and the value zero (0) otherwise. Third comparator 648 is configured to receive the accumulated signal 662 and to generate a second detection signal 666 indicating whether the accumulated signal 662 has a value less than or equal to a second predetermined threshold value, $T_2$. For example, second detection signal 666 may have the value one (1) if the accumulated signal 662 level is less than or equal to $T_2$, and the value zero (0) otherwise.

Logic gate 650 is configured to receive the first and second detection signals 664, 666 and to generate an intermediate slew rate detection signal 668 indicating whether either the first or second detect signals 664, 666 has a value of one (1). In some embodiments, logic gate 650 can be implemented as an OR gate. The illustrative circuit of FIG. 6B shows a logic gate 650 receiving input from two comparators 646, 648 having respective threshold values $T_1$, $T_2$. In some embodiments, logic gate 650 can receive input from three or more comparators having respective threshold values $T_1$, $T_2$, $T_3$, etc.

Delay 652 is provided to prevent a direct path from input 642 to output 654. As shown in FIG. 6B, FIR filter 644 can include a coefficient with no delay (i.e., it includes a one (1) term). That means that any change at input 642 would be immediately reflected at output 668. Without delay 654, slew rate boosting circuit 640 would react to this change and immediately produce a change that is reflected at 642. Delay 652 is provided to avoid this type of logic loop. In some embodiments, FIR filter 644 can have all delaying coefficients (i.e., not including a one (1) term) and delay 652 can be omitted. As output, delay 652 generates an output signal (or "flag") 670 indicating whether a slew rate limit condition is detected. Slew rate detection signal 670, which is provided at output 654, may correspond to slew rate detection signal 424 of FIGS. 4A-4C.

In one example, M=4, $T_1$=3, and $T_2$=−3, meaning that circuit 640, meaning that slew detector 640 will indicate a slew rate limit condition exists if the digital error signal 660 sums to an absolute value of at least 3 within a sliding window of 4 consecutive clock periods. The parameters M, $T_1$, $T_2$ may be hardcoded within slew rate detector 640 or stored in an EEPROM accessible thereto.

The slew rate detectors shown in FIGS. 6A and 6B are merely illustrative and other slew rate detector implementations can be used within disclosed tracking ADCs. For example, another implementation can employ two registers that hold the value of the code signal for N clock periods of difference. In more detail, this type of slew rate detector can receive an adjusted error signal (e.g., signal 420 above) and have two registers that hold, for example, the value of sample 1 and the value from sample N. If the difference between those two values is N (or close to N in the absolute sense) then it will trigger the slew rate detection signal. As in the other implementations, the number of clock periods and the threshold levels, and whether the thresholds have hysteresis are design choices. The difference in absolute value of these indicates the number of clock periods for which the tracking ADC has been slew rate limited. A threshold can be set, such that if the difference is, for example, 80% of N, a slew rate detection flag is set.

In some embodiments, a slew rate detector for use within a disclosed tracking ADC can include hysteresis. For example, referring to the embodiment of FIG. 6A, a first threshold may be used to change the slew rate detection signal 634 value from zero (0) to one (1) and a second, different threshold may be used to subsequently change value from one (1) to zero (0).

Figure 7A:
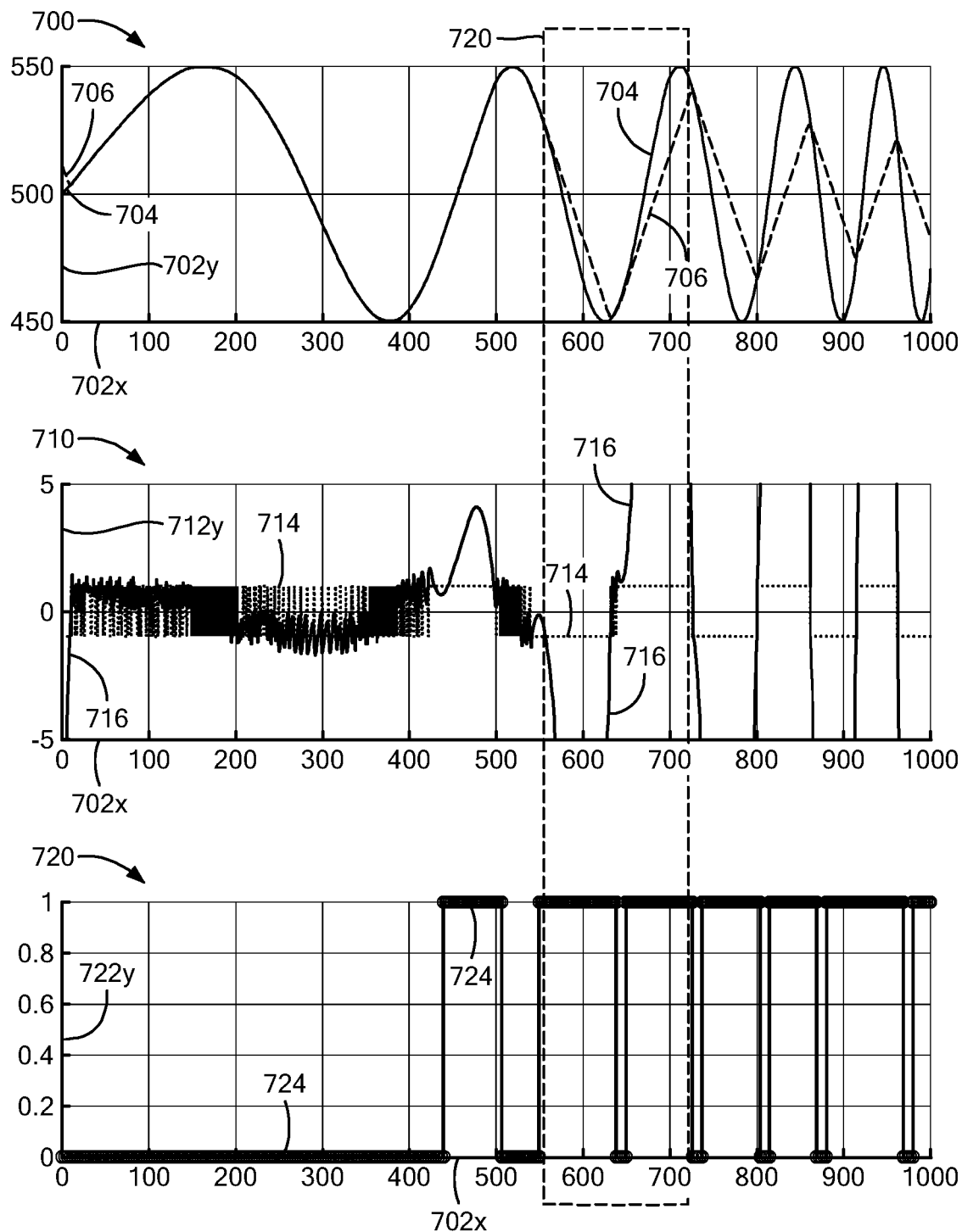
FIG. 7A includes a series of plots illustrating performance of a tracking ADC without adaptive slew rate boosting.
Figure 7B:
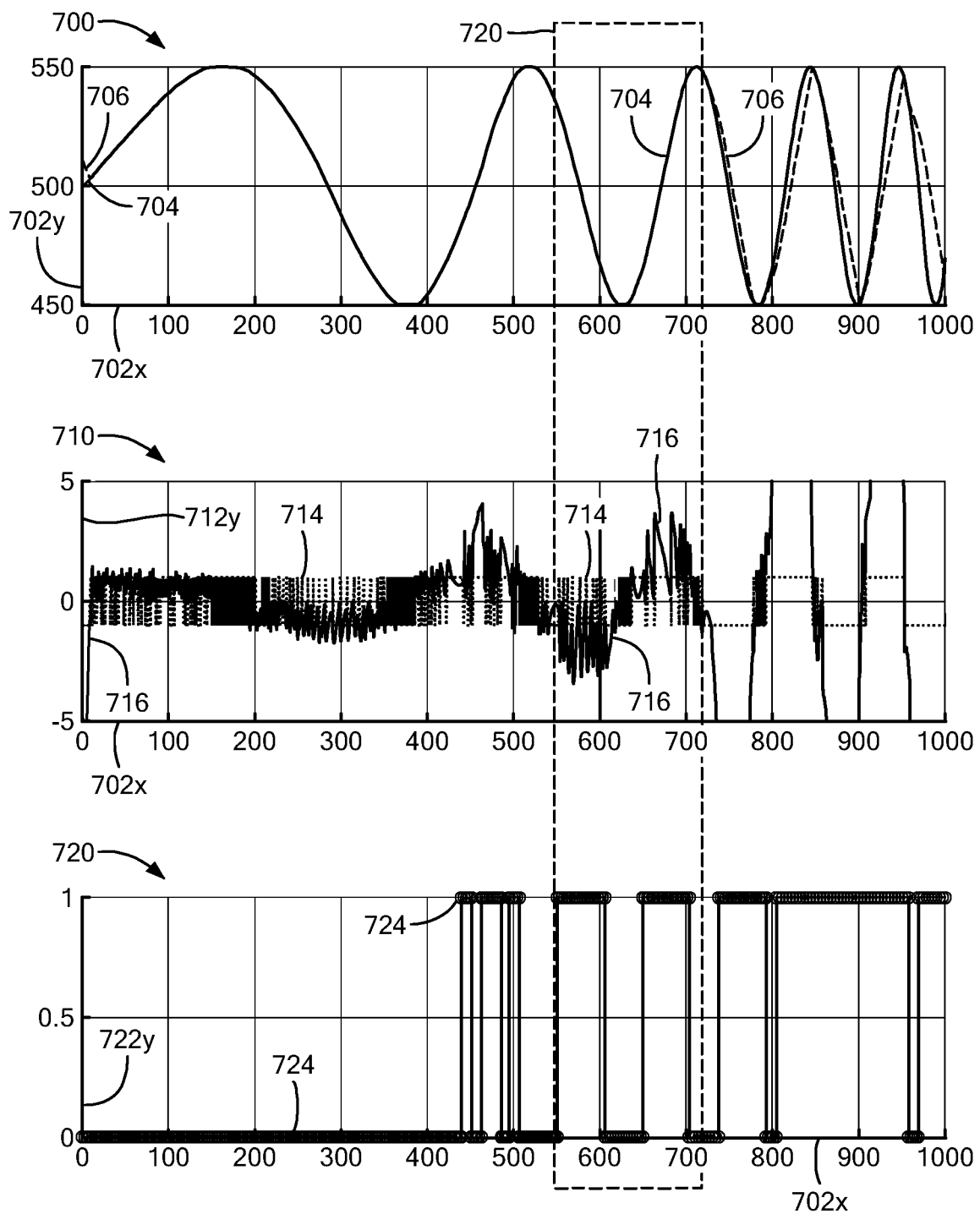
FIG. 7B includes a series of plots illustrating performance of a tracking ADC with adaptive slew rate boosting, according to some embodiments.

FIGS. 7A and 7B demonstrate the performance of a tracking ADC without adaptive slew rate boosting compared to that of a tracking ADC with adaptive slew rate boosting. In particular, FIG. 7A includes a series of plots generated during operation of a conventional tracking ADC or a disclosed tracking ADC with slew rate boosting disabled (e.g., a tracking ADC of FIGS. 4A-4C where slew rate detector 408 is disabled). In contrast, FIG. 7B includes a series of plots that generated during operation of a disclosed tracking ADC with adaptive slew rate boosting enabled.

Figure 1:
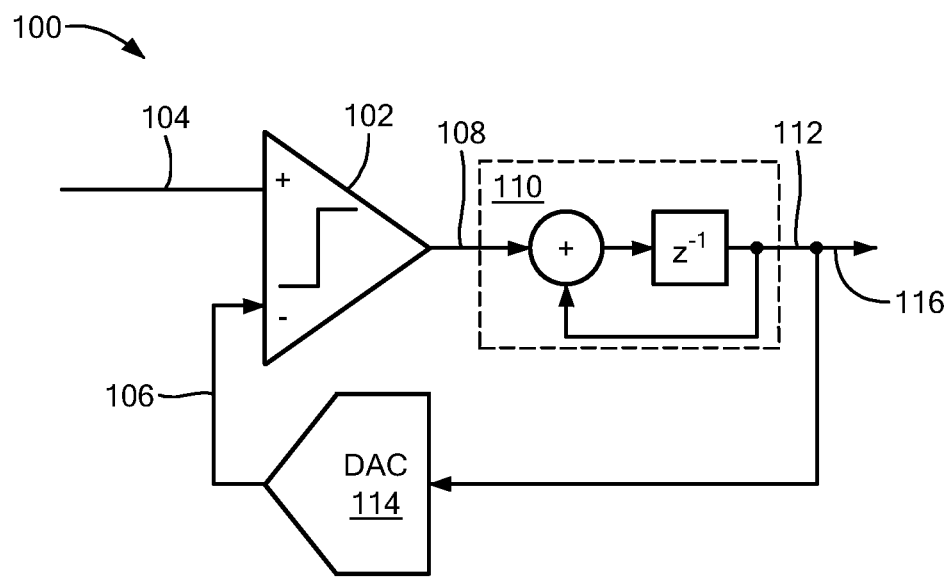
FIG. 1 is a block diagram of a prior art tracking analog-to-digital converter (ADC).
Figure 2:
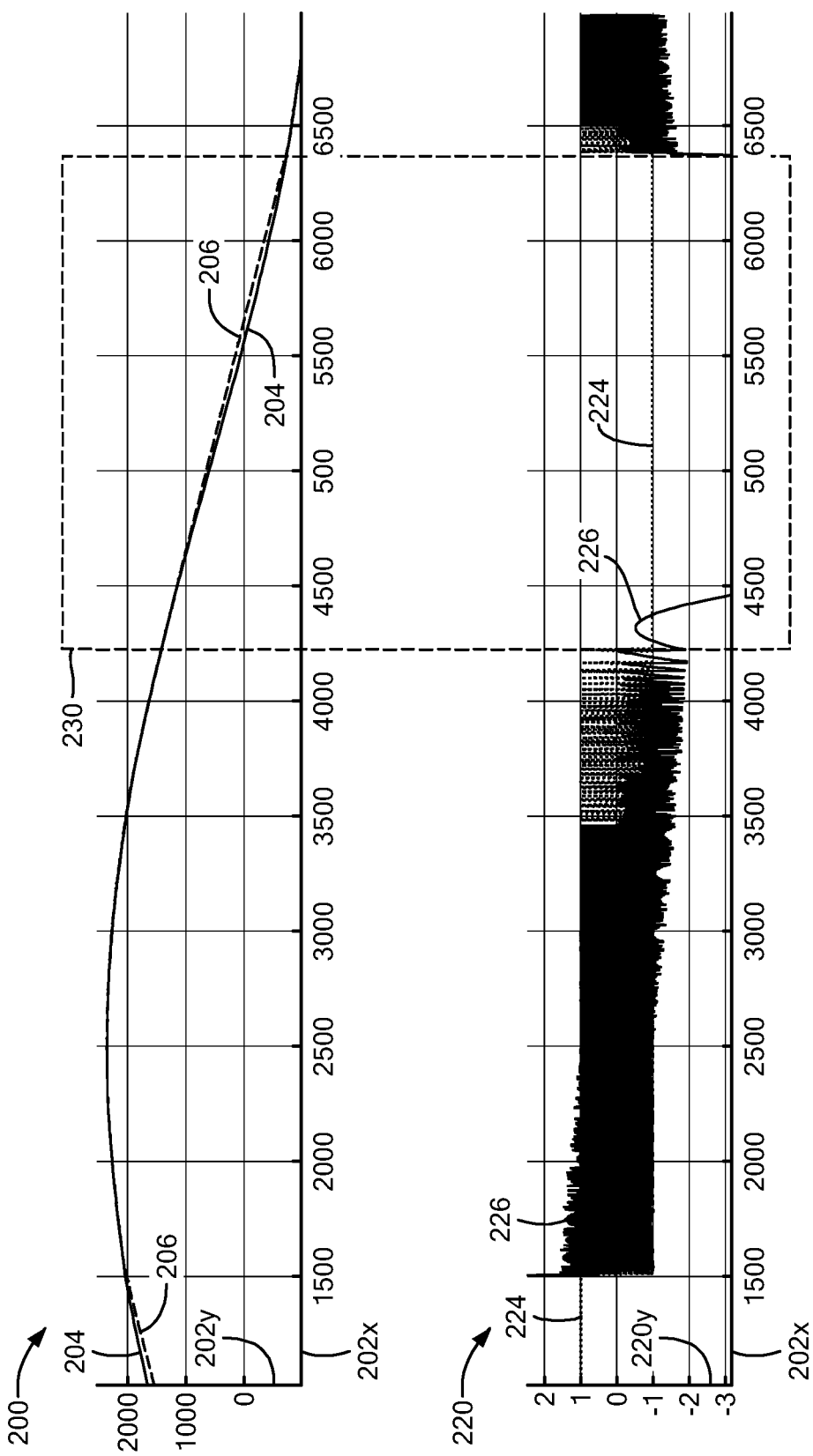
FIG. 2 includes a pair of plots illustrating a slew rate limit condition that can occur in a prior art tracking ADC.
Figure 3:
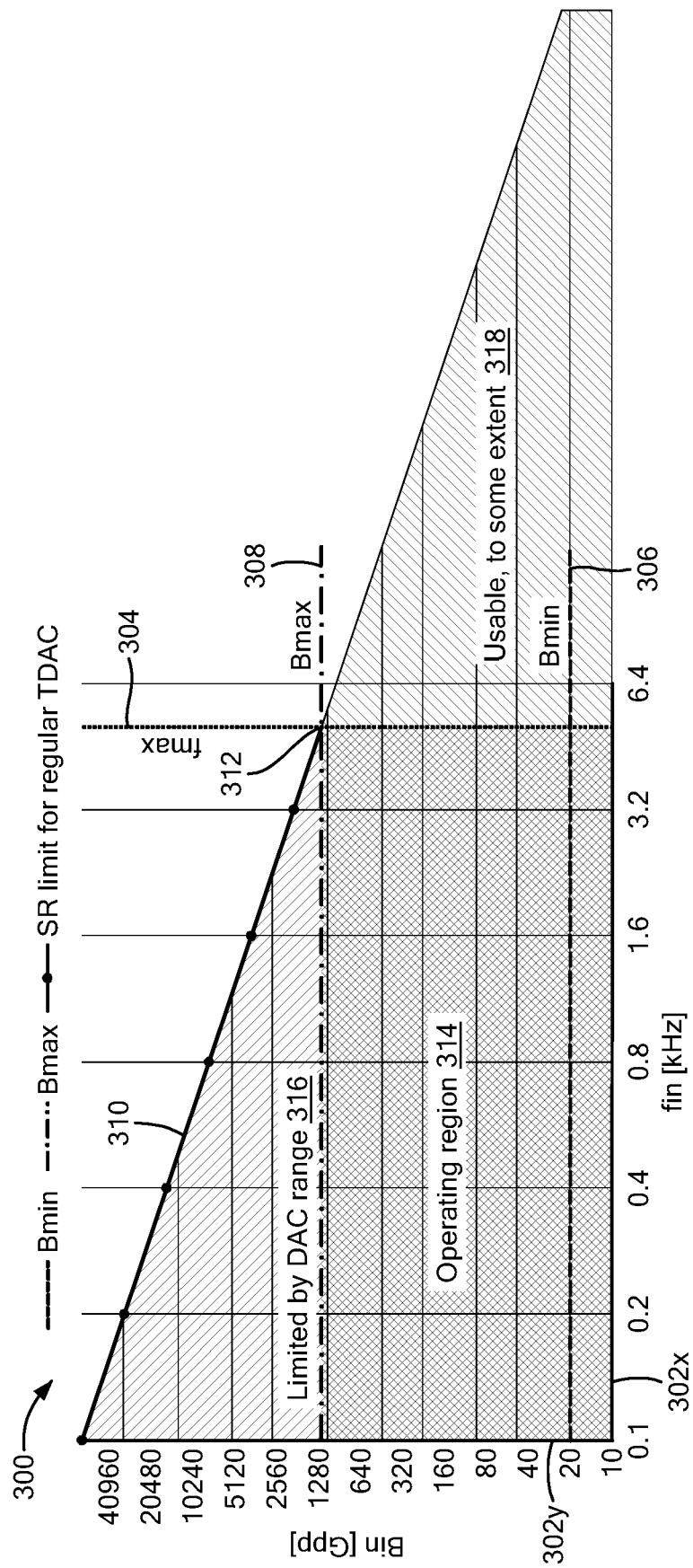
FIG. 3 is a log-log plot illustrating constraints on a tracking ADC as a function of analog input signal frequency and amplitude.

Referring to both FIGS. 7A and 7B, a first plot 700 has a horizontal axis 702x representing time (e.g., a number of clock periods) and a vertical axis 702y representing analog signal amplitude. Within the first plot 700, a first waveform 704 corresponds to an analog input signal (e.g., signal 104 in FIG. 1) and a second waveform 706 corresponds to a feedback signal generated by a DAC (e.g., signal 106 in FIG. 1). A second plot 710 shares horizontal axis 702x with first plot 700 and has a vertical axis 712y representing digital signal level. Within second plot 710, a first waveform 714 corresponds to a tracking ADC error signal (e.g., signal 108 in FIG. 1) and a second waveform 716 corresponds to a difference between the analog input signal 704 and the feedback signal 706. A third plot 720 shares horizontal axis 702x with first and second plots 700, 710 and has a vertical axis 722y representing digital signal level. Within third plot 720, waveform 724 corresponds to a slew rate detection signal (e.g., signal 424 of FIGS. 4A and 4B).

As shown in FIG. 7A, as the slew rate of the input signal 704 increases as a result of an increased frequency, a conventional tracking ADC—or disclosed tracking ADC with slew rate boosting disabled—fails to track the input signal. For example, during time period 720, DAC feedback signal 706 exhibits a sawtooth pattern whereas the input signal 704 is sinusoidal. That is, the DAC feedback signal 706 and the input signal 704 become separated. It can also be seen in FIG. 7A that the difference 716 between the analog input signal 704 and the DAC feedback signal 706 grows unbounded during time period 720. In contrast, as shown in FIG. 7B, a tracking ADC with slew rate boosting more accurately tracks the input signal during the same time period 720 and waveform 716 remains bounded. This improvement results from detecting a slew rate limit condition (as illustrated in plot 720) and, in response, boosting the digital error signal using disclosed structures and techniques. Of note, during periods where slew rate boosting is active (e.g., during portions of time period 720), the difference 716 between the analog input signal 704 and the DAC feedback signal 706 increases (as an absolute value) due to the boosted digital error signal. Such temporary increases in quantization noise are a tradeoff that enables disclosed ADCs to track input signals with higher slew rates compared conventional tracking ADCs with similar specifications.

Figure 8:
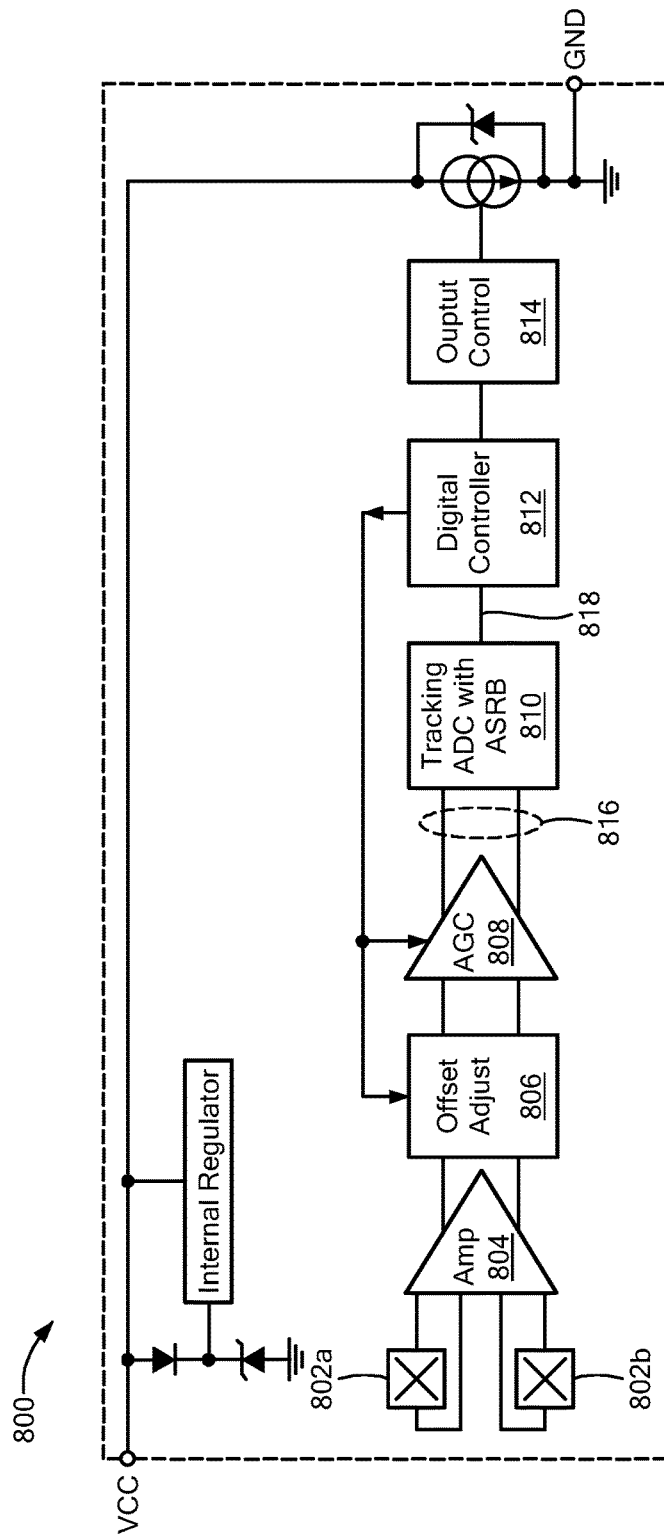
FIG. 8 is a block diagram of a sensor integrated circuit (IC) that includes a tracking ADC with adaptive slew rate boosting, according to some embodiments.

Turning to FIG. 8, disclosed tracking ADC embodiments can be used within various types of circuits, such as within a sensor integrated circuit (IC) 800. The illustrative sensor IC 800 can include a pair of magnetic field sensing elements 802a, 802b, an amplifier 804, an offset adjustment circuit 806, an automatic gain controller (AGC) 808, a tracking ADC with adaptive slew rate boosting (ASRB) 810, a digital controller 812, and an output controller 814.

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

Magnetic field sensing elements 802a, 802b provide signals representative of the strength of a detected magnetic field. These signals are processed by analog circuitry including amplifier 804, offset adjustment circuit 806, and AGC 808 to provide an analog signal 816 as input to tracking ADC 810. In response, tracking ADC 810 provides a digital signal 818 to digital circuitry including digital controller 812 and output controller 814. Tracking ADC 810 can be the same as or similar to a tracking ADC embodiment described above in the context of FIGS. 4A-4C. That is, tracking ADC 810 can adaptively adjust its error signal level and/or clock frequency in response to detecting a slew rate limit condition. Digital controller 812 can be configured to control an offset within offset adjustment circuit 806 and/or a gain of AGC 808. For example, digital controller 812 can decrease the gain of AGC 808 if a peak-to-peak value of digital signal 818 exceeds a certain threshold value. Digital controller 812 can further process the digital signal 818 in order to detect characteristics of a proximate target, such as rotation, speed, direction, and/or angle. The sensor output signal can be provided to the power (VCC) and ground (GND) connections of the sensor 800 under the control of output controller 814 as illustrated. In other embodiments, the sensor output signal can be provided at a third dedicated output terminal.

It is appreciated herein that a tracking ADC with adaptive slew rate boosting can allow for more effective control of the gain within systems and devices having an AGC, such as sensor IC 800. With conventional tracking ADCs, when the analog input signal has large amplitude and/or frequency, the resulting digital signal may be a triangular having a peak-to-peak value that is significantly less than that of the input signal due to slew rate limitations. If the peak-to-peak value of the digital signal is not large enough to trigger the controller to reduce gain, then the digital signal can remain distorted for an extended period of time or indefinitely (i.e., a "latch-up" scenario can occur). In contrast, using a disclosed tracking ADC with adaptive slew rate boosting, the digital signal can better track the input signal such that the peak-to-peak value of the digital signal is substantially the same as that of the input signal. This results in proper gain reduction to reduce/eliminate the (baseline) slew rate limit condition.

The subject matter described herein can be implemented in digital electronic circuitry, or in computer software, firmware, or hardware, including the structural means disclosed in this specification and structural equivalents thereof, or in combinations of them. The subject matter described herein can be implemented as one or more computer program products, such as one or more computer programs tangibly embodied in an information carrier (e.g., in a machine-readable storage device), or embodied in a propagated signal, for execution by, or to control the operation of, data processing apparatus (e.g., a programmable processor, a computer, or multiple computers). A computer program (also known as a program, software, software application, or code) can be written in any form of programming language, including compiled or interpreted languages, and it can be deployed in any form, including as a stand-alone program or as a module, component, subroutine, or another unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification, including the method steps of the subject matter described herein, can be performed by one or more programmable processors executing one or more computer programs to perform functions of the subject matter described herein by operating on input data and generating output. The processes and logic flows can also be performed by, and apparatus of the subject matter described herein can be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processor of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of nonvolatile memory, including by ways of example semiconductor memory devices, such as EPROM, EEPROM, flash memory device, or magnetic disks. The processor and the memory can be supplemented by, or incorporated in, special purpose logic circuitry.

In the foregoing detailed description, various features are grouped together in one or more individual embodiments for the purpose of streamlining the disclosure. This method of disclosure is not to be interpreted as reflecting an intention that each claim requires more features than are expressly recited therein. Rather, inventive aspects may lie in less than all features of each disclosed embodiment.

The disclosed subject matter is not limited in its application to the details of construction and to the arrangements of the components set forth in the following description or illustrated in the drawings. The disclosed subject matter is capable of other embodiments and of being practiced and carried out in various ways. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

The invention claimed is:

1. A tracking analog-to-digital converter (ADC) comprising:
   a comparator having a first input to receive an analog input signal, a second input to receive an analog feedback signal, and an output to provide a digital error signal responsive to a comparison between the analog input signal and the analog feedback signal;
   a slew rate detection circuit to generate a slew rate detection signal responsive to a slew rate of the analog input signal;
   an error adjustment circuit having a first input to receive the digital error signal, a second input to receive the slew rate detection signal, and an output to provide an adjusted error signal responsive to the digital error signal and the slew rate detection signal;
   an integrator having an input to receive the adjusted error signal and an output to provide a digital output signal having a value that increases or decreases at each period of a clock according to the adjusted error signal; and
   a digital-to-analog converter (DAC) having an input to receive the digital output signal and an output to provide the analog feedback signal responsive to the digital output signal.

2. The tracking ADC of claim 1, wherein the slew rate detection circuit is configured to generate the slew rate detection signal responsive to a slew rate of the analog input signal using an input signal corresponding to at least one:
   the digital error signal;
   the adjusted error signal; or
   the digital output signal.

3. The tracking ADC of claim 2, wherein the slew rate detection circuit comprises:
   a discrete-time integrator to integrate the slew rate detector input signal over N clock periods to generate an integrated signal; and
   one or more comparators to compare a value of the integrated signal to one or more respective threshold values,
   wherein the slew rate detection signal has a value responsive to outputs of the one or more comparators.

4. The tracking ADC of claim 3, wherein the one or more comparators comprise at least a first comparator to compare the value of the integrated signal to a first threshold value greater than zero and a second comparator to compare the value of the integrated signal to a second threshold value less than zero, the slew rate detection circuit further comprising:
   a logic gate to generate an intermediate slew rate detection signal responsive to outputs of the one or more comparators; and
   a D latch configured to update the value of slew rate detection signal to match that of intermediate slew rate detection signal according to a reset signal.

5. The tracking ADC of claim 2, wherein the slew rate detection circuit comprises:
   a discrete finite impulse response (FIR) filter to calculate a moving sum of the slew rate detector input signal over N clock periods; and one or more comparators to compare the moving sum of the integrated signal to one or more respective threshold values, wherein the slew rate detection signal has a value responsive to outputs of the one or more comparators.

6. The tracking ADC of claim 1, wherein the slew rate detection circuit is configured to generate the slew rate detection signal responsive to a slew rate of the analog input signal using hysteresis.

7. The tracking ADC of claim 1, wherein the error adjustment circuit is configured to generate the adjusted error signal by multiplying the digital error signal by a first multiplier value if the slew rate detection signal has a first value and multiplying the digital error signal by a second multiplier value if the slew rate detection signal has second value.

8. The tracking ADC of claim 7, wherein the first multiplier value is equal to one and the second multiplier value is greater than one.

9. The tracking ADC of claim 7, wherein the error adjustment circuit comprises:
a multiplexer to selectively output the one of a plurality of multiplier values responsive to a value of the slew rate detection signal, the plurality of multiplier values including at least the first multiplier value and the second multiplier value; and
a digital multiplier to multiply the digital error signal by the output of the multiplexer to generate the adjusted error signal.

10. The tracking ADC of claim 7, wherein the error adjustment circuit comprises:
a first amplifier to amplify the digital error signal by one of the first multiplier value or the second multiplier value;
a switch to having a first input coupled to receive a first input signal from an output of the first amplifier and a second input signal corresponding to either the digital error signal or an output of a second amplifier configured to multiply the digital error signal by the other one of the first multiplier value or the second multiplier value, the switch configured to selectively output the first input signal or the second input signal as the adjusted digital error signal responsive to a value of the slew rate detection signal.

11. A tracking analog-to-digital converter (ADC) comprising:
a comparator having a first input to receive an analog input signal, a second input to receive an analog feedback signal, and an output to provide a digital error signal responsive to a comparison between the analog input signal and the analog feedback signal;
a slew rate detection circuit to generate a slew rate detection signal responsive to a slew rate of the analog input signal;
a clock adjustment circuit having an input to receive the slew rate detection signal, and an output to provide commands to adjust a frequency of a clock responsive to the slew rate detection signal;
an integrator having an input to receive the digital error signal and an output to provide a digital output signal having a value that increases or decreases at each period of the clock according to the digital error signal; and a digital-to-analog converter (DAC) having an input to receive the digital output signal and an output to provide the analog feedback signal responsive to the digital output signal.

12. The tracking ADC of claim 11, wherein the slew rate detection circuit is configured to generate the slew rate detection signal responsive to a slew rate of the analog input signal using an input signal corresponding to at least one:
the digital error signal; or
the digital output signal.

13. The tracking ADC of claim 12, wherein the slew rate detection circuit comprises:
a discrete-time integrator to integrate the slew rate detector input signal over N clock periods to generate an integrated signal; and
one or more comparators to compare a value of the integrated signal to one or more respective threshold values,
wherein the slew rate detection signal has a value responsive to outputs of the one or more comparators.

14. The tracking ADC of claim 13, wherein the one or more comparators comprise at least a first comparator to compare the value of the integrated signal to a first threshold value greater than zero and a second comparator to compare the value of the integrated signal to a second threshold value less than zero, the slew rate detection circuit further comprising:
a logic gate to generate an intermediate slew rate detection signal responsive to outputs of the one or more comparators; and
a D latch configured to update the value of slew rate detection signal to match that of intermediate slew rate detection signal according to a reset signal.

15. The tracking ADC of claim 12, wherein the slew rate detection circuit comprises:
a discrete finite impulse response (FIR) filter to calculate a moving sum of the slew rate detector input signal over N clock periods; and
one or more comparators to compare the moving sum of the integrated signal to one or more respective threshold values,
wherein the slew rate detection signal has a value responsive to outputs of the one or more comparators.

16. The tracking ADC of claim 11, wherein the slew rate detection circuit is configured to generate the slew rate detection signal responsive to a slew rate of the analog input signal using hysteresis.

17. A tracking analog-to-digital converter (ADC) comprising:
means for generating a digital error signal responsive to a comparison between an analog input signal and an analog feedback signal;
means for integrating the digital error signal or an adjusted version of the digital error signal over multiple clock periods to generate a digital output signal;
means for converting the digital output signal to the analog feedback signal;
means for detecting a slew rate limit condition of the tracking ADC; and
means for adjusting one or more operational parameters of the tracking ADC in response to detection of the slew rate limit condition.

* * * * *

UNITED STATES PATENT AND TRADEMARK OFFICE
CERTIFICATE OF CORRECTION

| | |
|---|---|
| PATENT NO. | : 11,218,161 B1 |
| APPLICATION NO. | : 17/098905 |
| DATED | : January 4, 2022 |
| INVENTOR(S) | : Leandro Fuentes et al. |

It is certified that error appears in the above-identified patent and that said Letters Patent is hereby corrected as shown below:

In the Specification

Column 8, Line 42 delete "error adjustment circuit 416" and replace with --error adjustment circuit 410--.

Column 9, Lines 15-16 delete "digital error signal 504" and replace with --digital error signal 510--.

Signed and Sealed this
Thirteenth Day of February, 2024

Katherine Kelly Vidal
*Director of the United States Patent and Trademark Office*